(12) United States Patent
Takizawa

(10) Patent No.: US 7,372,106 B2
(45) Date of Patent: May 13, 2008

(54) SEMICONDUCTOR DEVICE AND METHOD FOR MANUFACTURING SEMICONDUCTOR DEVICE

(75) Inventor: Teruo Takizawa, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 278 days.

(21) Appl. No.: 10/944,260

(22) Filed: Sep. 17, 2004

(65) Prior Publication Data
US 2005/0104126 A1 May 19, 2005

(30) Foreign Application Priority Data
Sep. 19, 2003 (JP) ............................. 2003-327755

(51) Int. Cl.
H01L 27/01 (2006.01)
(52) U.S. Cl. ...................... 257/349; 438/149
(58) Field of Classification Search ................ 257/59, 257/72, 66, 347–350, 352–354, 401, E29.117; 349/42, 43, 47; 438/149, 153, 154
See application file for complete search history.

(56) References Cited

U.S. PATENT DOCUMENTS 5,815,223 A * 9/1998 Watanabe et al. ............. 349/42
6,114,715 A * 9/2000 Hamada ....................... 257/72
6,225,665 B1 5/2001 Hirano
6,383,850 B2 5/2002 Hirano
6,573,533 B1 6/2003 Yamazaki
6,825,820 B2 * 11/2004 Yamazaki et al. ............ 345/76
6,940,138 B2 9/2005 Yamazaki

FOREIGN PATENT DOCUMENTS

| JP | 02-214165 | 8/1990 |
| JP | 05-067785 | 3/1993 |
| JP | 2000-269509 | 9/2000 |
| JP | 2001-94114 | 4/2001 |
| JP | 2004-200475 | 7/2004 |

OTHER PUBLICATIONS

Japanese Office Action dated Jul. 3, 2007.

* cited by examiner

Primary Examiner—David Vu
(74) Attorney, Agent, or Firm—John J. Penny, Jr.; Edwards Angell Palmer & Dodge LLP

(57) ABSTRACT

A semiconductor device comprising electric field relieving regions 8a and 8b for alleviating the electric fields between a source layer 6a and body-source connection layers 7a and 7b formed along borders between the source layer 6a and the body-source connection layers 7a and 7b, and source contacts C1 and C2 for making contact between the source layer 6a and the body-source connection layers 7a and 7b are formed to extend across the electric field relieving regions 8a and 8b, respectively.

10 Claims, 5 Drawing Sheets

SEMICONDUCTOR DEVICE AND METHOD FOR MANUFACTURING SEMICONDUCTOR DEVICE

The present application claims foreign priority from Japanese Application No. 2003-327755 filed on Sep. 19, 2003, which is hereby incorporated by reference in its entirety.

BACKGROUND OF THE INVENTION

1. Technical Field

The present invention relates to semiconductor devices and methods for manufacturing semiconductor devices, in particular, which are preferably applied to a body-source connection type (source-tied type) transistor formed on a SOI (Silicon on Insulator) wafer.

2. Related Art

MOS transistors formed on a SOI wafer have characteristics such as easiness in element isolation, latch-up-free property, and small source/drain junction capacitance, and thus their utility is attracting attention.

In particular, because fully-depleted SOI transistors can achieve low power consumption and high-speed operations, and they can be easily operated at low voltages, research into operation of SOI transistors in a fully-depleted mode is actively conducted.

However, in order to operate a SOI transistor in a fully-depleted mode, the thickness of the SOI film needs to be thinned down. For this reason, a punch-through phenomenon would likely occur due to the drain induced potential barrier lowering (DIBL: Drain Induced Barrier Lowering), and the drain breakdown voltage of the SOI transistor decreases.

On the other hand, if the SOI film is thickened to prevent the drain breakdown voltage from decreasing, the SOI transistor shifts from a fully-depleted mode to a partially depleted mode, and the low voltage operation of the SOI transistor becomes difficult.

Moreover, Japanese Laid-open Patent Application HEI 5-67785 describes a method for improving the drain breakdown voltage of a SOI transistor and achieving higher operation speeds, in which a concave section is formed in a semiconductor layer of a SOIwafer, and a gate electrode is formed over the concave channel region interposed between source/drain regions.

In addition, in the SOI transistor, when the SOI film thickness is thinned, and the bottoms of the source/drain regions come in contact with the dielectric layer, the body region under the gate electrode is isolated, and the drain breakdown voltage deteriorates by accumulation of impact ionized carriers. Accordingly, there are methods of releasing the impact ionized carriers accumulated in the body region, for example, by connecting the body region under the gate electrode with the source region (body-source connection type), or connecting the body region with the gate electrode (dynamic threshold type).

FIG. 5(a) is a plan view schematically showing a structure of a conventional semiconductor device, FIG. 5(b) is a cross-sectional view taken along lines A2-A2 of FIG. 5(a), and FIG. 5(c) is a cross-sectional view taken along lines B2-B2 of FIG. 5(a).

In FIGS. 5(a)-5(c), a single-crystalline silicon layer 23 is formed on a dielectric layer 21, and the single-crystalline silicon layer 23 is isolated by an element isolation dielectric layer 22. Further, a gate electrode 25 is formed on the single-crystalline silicon layer 23 through a gate dielectric layer 24. Also, a source layer 26a and a drain layer 26b are formed in the single-crystalline silicon layer 23 disposed on both sides of the gate electrode 25. As shown in FIG. 5(b), bottom surfaces of the source layer 26a and the drain layer 26b contact the dielectric layer 21, and a body region below the gate electrode 25 is isolated between the source layer 26a and the drain layer 26b.

Also, body-source connection layers 27a and 27b that contact the body region below the gate electrode 25 and disposed in a manner to interpose the source layer 26a are formed in the single-crystalline silicon layer 23 on the side of the source layer 26a. Also, an interlayer dielectric film 29 is formed on the single-crystalline silicon layer 23 where the gate electrode 25 is formed, and source contacts C11 and C12 for making contact with the source layer 26a and the body-source connection layers 27a and 27b are formed on the side of the source layer 26a.

In other words, contact holes K11 and K12 are formed in a manner to cross the borders between the source layer 26a and the body-source connection layers 27a and 27b in the interlayer dielectric film 29, as shown in FIG. 5(c). Further, the source layer 26a and the body-source connection layers 27a and 27b are connected to source wirings 30a and 30b through the contact holes K11 and D12, respectively.

Also, a gate contact C15 for making contact with the gate electrode 25 is formed on the gate electrode 25, and drain contacts C13 and C14 for making contact with the drain layer 26b are formed on the drain layer 26b.

Here, if an n-channel transistor is assumed to be formed in the single-crystalline silicon layer 23, the single-crystalline silicon layer 23 and the body-source connection layers 27a and 27b are set to be p-type, and the source layer 26a and the drain layer 26b are set to be $n^+$ type.

For this reason, even when holes generated at an edge of the drain flow in the body region, they can be discharged to the source wirings 30a and 30b through the body-source connection layers 27a and 27b, and impact ionized carriers are controlled so as not to accumulate in the body region.

However, the body-source connection type shown in FIGS. 5(a)-5(c) has a problem in that, because the body-source connection layers 27a and 27b are disposed in a manner to contact the source layer 26a, holes, when flowing from the body region to the source layer 26a, cause an impact ionization at a pn junction formed between the body-source connection layers 27a and 27b, and this lowers the drain breakdown voltage.

Therefore, it is an object of the present invention to provide semiconductor devices and methods for manufacturing semiconductor devices, which are capable of suppressing an impact ionization at a border of a body-source connection layer.

SUMMARY OF THE INVENTION

To solve the problems described above, a semiconductor device in accordance with an embodiment of the present invention is characterized in comprising: a semiconductor layer formed on a dielectric layer; a gate electrode disposed on the semiconductor layer; a source layer disposed on one side of the gate electrode and formed in the semiconductor layer; a drain layer disposed on another side of the gate electrode and formed in the semiconductor layer; a body-source connection layer that connects a body region below the gate electrode and the source layer; and an electric field relieving region provided between the source layer and the body-source connection layer.

As a result, an electric field of a pn junction formed between the body-source connection layer and the source layer can be alleviated. Accordingly, an impact ionization between the body-source connection layer and the source layer can be suppressed, carriers in the body region can be released, and the drain breakdown voltage can be prevented from lowering.

Also, a semiconductor device in accordance with an embodiment of the present invention is characterized in further comprising a contact region that is disposed to extend across the electric field relieving region and connects the source layer and the body-source connection layer.

Accordingly, by providing the contact region over the electric field relieving region, the source layer can be connected with the body-source connection layer, and even when the electric field relieving region is provided between the source layer and the body-source connection layer, an enlargement of the contact area can be suppressed.

Further, a semiconductor device in accordance with an embodiment of the present invention is characterized in that the electric field relieving region defines a one-sided abrupt junction type pn junction, a graded junction type pn junction, or a p-i-n junction.

As a result, the electric field relieving region can be formed between the body-source connection layer and the source layer by adjusting the concentration or the kind of impurity, and the electric field between the body-source connection layer and the source layer can be readily alleviated.

Further, a semiconductor device in accordance with an embodiment of the present invention is characterized in that the electric field relieving region has an impurity concentration gradient set so that an electric field of 6 MV/cm or more is not applied.

As a result, an impact ionization between the body-source connection layer and the source layer can be suppressed, and the drain breakdown voltage can be prevented from lowering.

Further, a semiconductor device in accordance with an embodiment of the present invention is characterized in that the semiconductor layer formed on the dielectric layer is formed on a SOI wafer.

As a result, element isolation of MOS transistors can be facilitated, latch up can be prevented, and also, the source/drain junction capacity can be reduced such that the MOS transistors can attain higher speeds.

Furthermore, a method for manufacturing a semiconductor device in accordance with an embodiment of the present invention, is characterized in comprising the steps of: forming a gate electrode on a semiconductor layer on a dielectric layer; forming source/drain layers disposed respectively on both sides of the gate electrode in the semiconductor layer; forming a body-source connection layer that connects a body region below the gate electrode and the source layer in the semiconductor layer; and forming an electric field relieving region provided between the source layer and the body-source connection layer.

As a result, carriers in the body region can be released, the electric field between the body-source connection layer and the source layer can be alleviated, and the drain breakdown voltage of the SOI transistor can be improved.

Furthermore, a method for manufacturing a semiconductor device in accordance with an embodiment of the present invention is characterized in that the step of forming the electric field relieving region comprises disposing the body-source connection layer at a specified distance separated from the source layer.

As a result, by changing resist patterns used for forming the source/drain layers or the body-source connection layers, the electric field between the body-source connection layers and the source layer can be alleviated while enabling carriers in the body region to be released, and a higher breakdown voltage of the SOI transistor can be achieved while suppressing an increase in the manufacturing steps.

DESCRIPTION OF TE PREFERRED EMBODIMENTS

Semiconductor devices and methods for manufacturing the same in accordance with embodiments of the present invention are described below with reference to the accompanying drawings.

Figure 1:
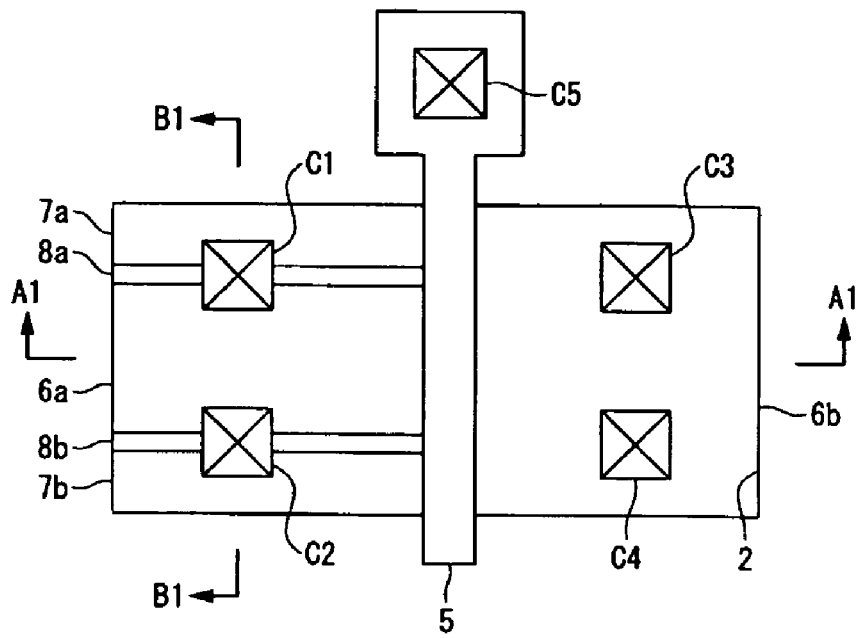
FIGS. 1(a)-1(c) are views schematically showing a structure of a semiconductor device in accordance with a first embodiment of the present invention.
Figure 1:
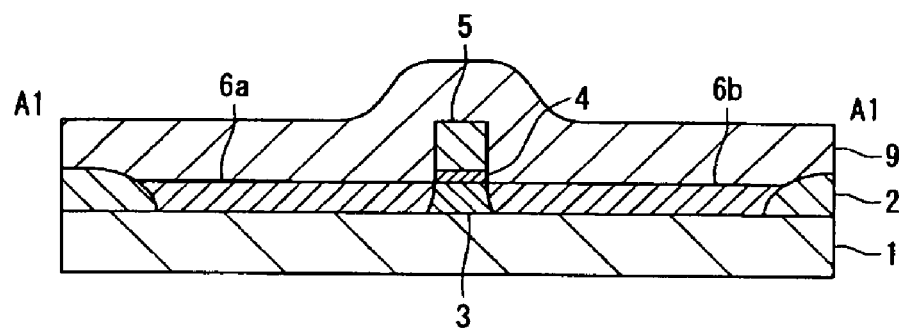
Figure 1C:
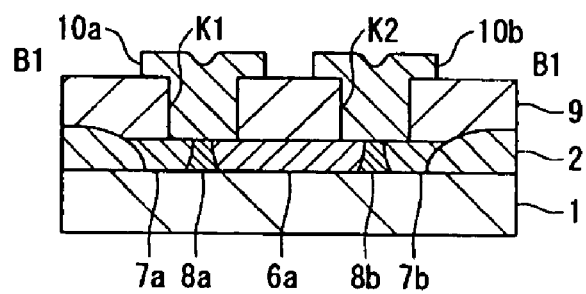
Figure 2:
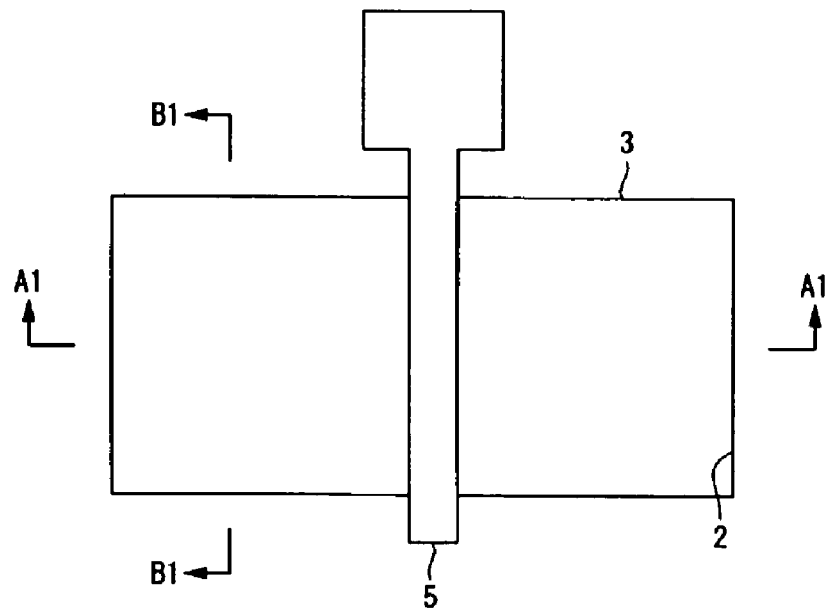
FIGS. 2(a)-2(c) are views showing a method for manufacturing a semiconductor device in accordance with the first embodiment of the present invention.
Figure 2:
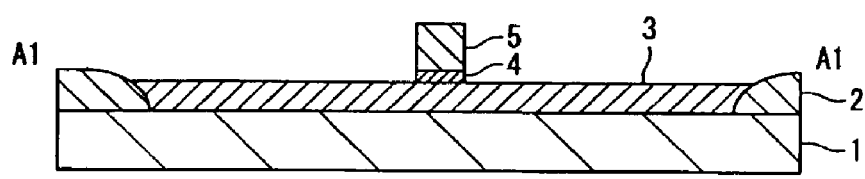
Figure 2:
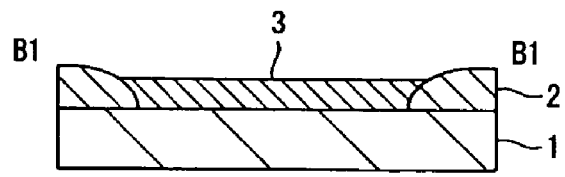
Figure 3:
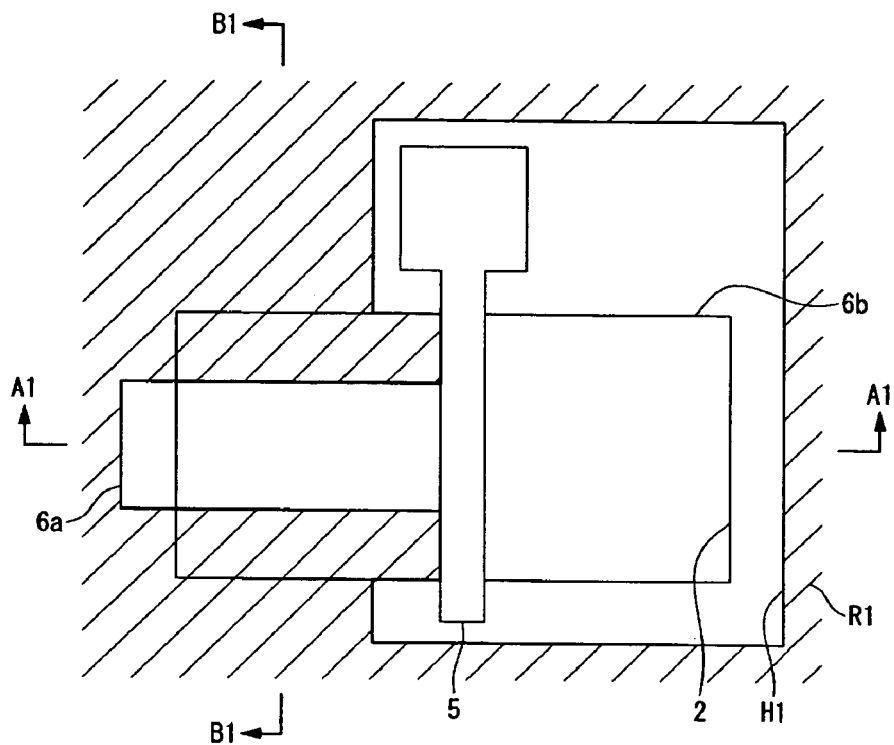
FIGS. 3(a)-3(c) are views showing the method for manufacturing a semiconductor device in accordance with the first embodiment of the present invention.
Figure 3:
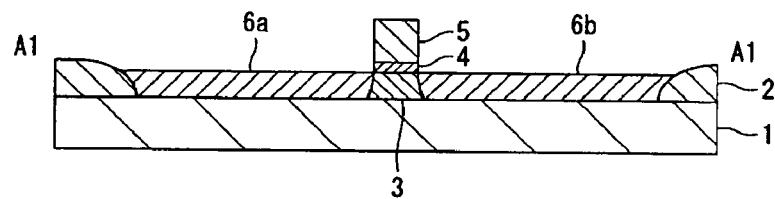
Figure 3:
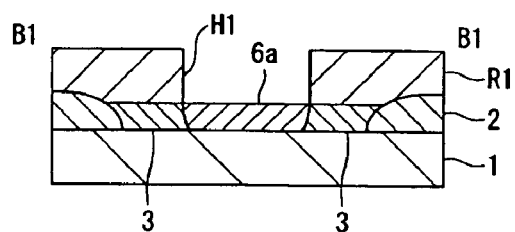
Figure 4:
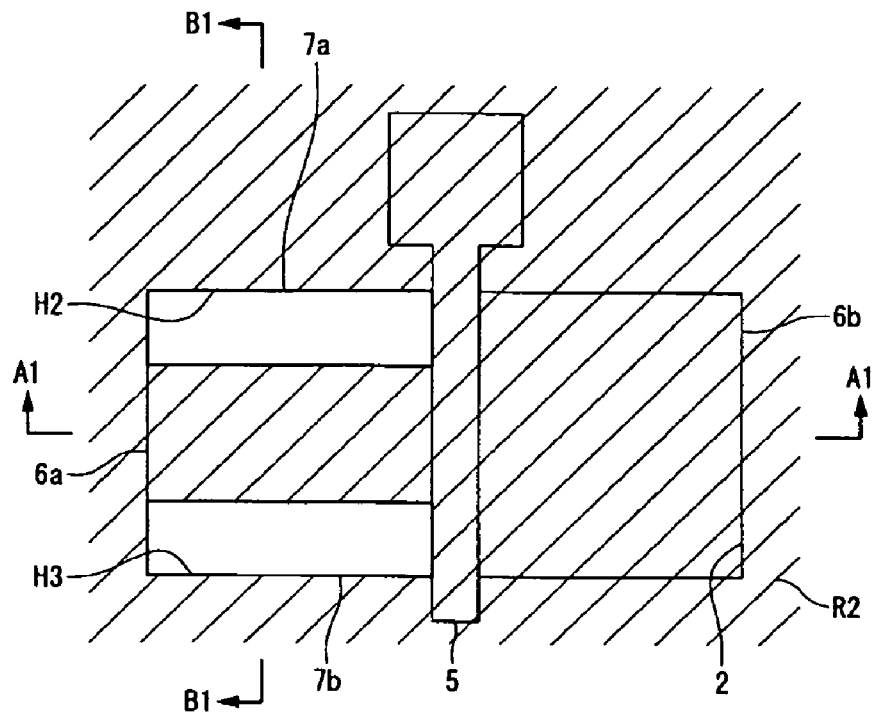
FIGS. 4(a)-4(c) are views showing the method for manufacturing a semiconductor device in accordance with the first embodiment of the present invention.
Figure 4:
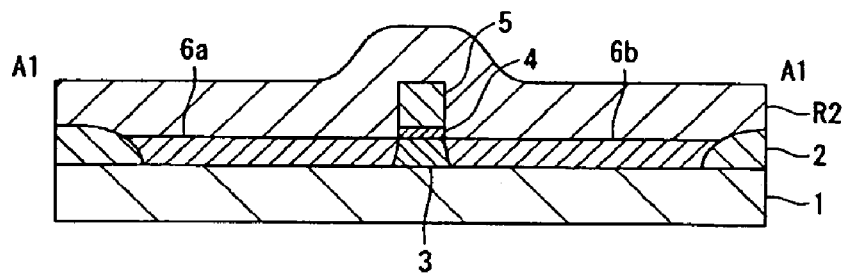
Figure 4:
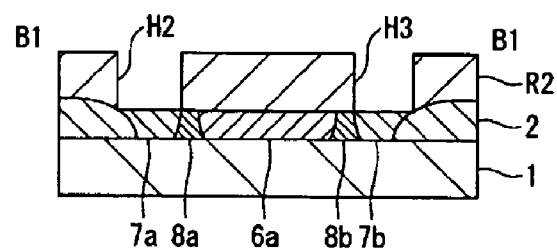
Figure 5:
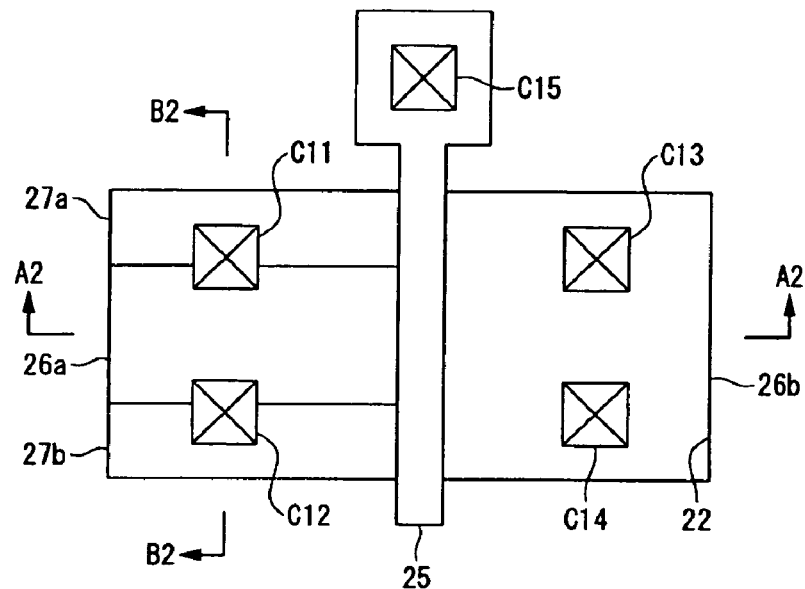
FIGS. 5(a)-5(c) are views schematically showing a structure of a conventional semiconductor device.
Figure 5:
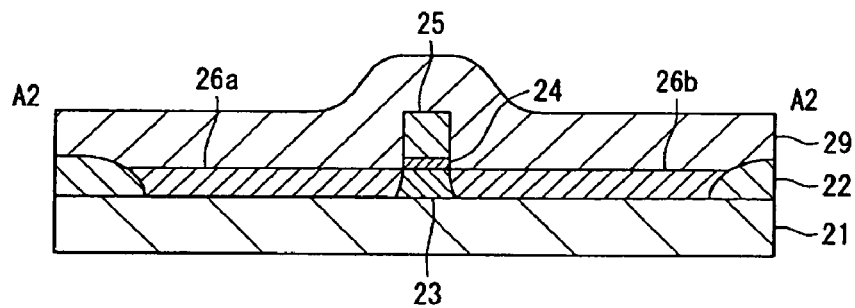
Figure 5:
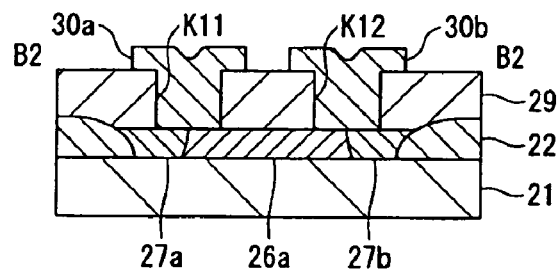

FIG. 1(a) is a plan view schematically showing a structure of a semiconductor device in accordance with a first embodiment of the present invention, FIG. 1(b) is a cross-sectional view taken along lines A1-A1 in FIG. 1(a), and FIG. 1(c) is a cross-sectional view taken along lines B1-B1 in FIG. 1(a).

In FIG. 1(b), a single-crystalline silicon layer 3 is formed on a dielectric layer 1, and the single-crystalline silicon layer 3 is isolated by an element isolation dielectric layer 2. As the material of the single-crystalline semiconductor layer 3, for example, Si, SiGe, GaAs, InP, GaP or GaN can be used, and as the dielectric layer 1, for example, an oxide film can be used. Furthermore, as the semiconductor substrate in which the semiconductor layer 3 is formed on the dielectric layer 1, for example, a SOI wafer can be used. As the SOI wafer, for example, a SIMOX (Separation by Implanted Oxygen) wafer, a bounded wafer, or a recrystallized silicon on glass by laser-annealing can be used. Also, besides the semiconductor substrate, a sapphire substrate or a glass substrate may be used as a handle substrate. Also, as the element isolation dielectric film 2, a field oxide film by LOCOS, STI (Shallow Trench Isolation), or the like can be used.

Further, a gate electrode 5 is formed on the single-crystalline silicon layer 3 through a gate dielectric layer 4. Also, a source layer 6a and a drain layer 6b are formed in the single-crystalline silicon layer 3 disposed on both sides of the gate electrode 5. As shown in FIG. 1(b), bottom surfaces of the source layer 6a and the drain layer 6b can be in contact with the dielectric layer 1, and a body region below the gate electrode 5 is isolated between the source layer 6a and the drain layer 6b.

Also, body-source connection layers 7a and 7b that contact the body region below the gate electrode 5 and disposed in a manner to interpose the source layer 6a are formed in the single-crystalline silicon layer 3 on the side of the source layer 6a. Further, electric field relieving regions 8a and 8b that alleviate the electric field between the source layer 6a and the body-source connection layers 7a and 7b are formed along borders between the source layer 6a and the body-source connection layers 7a and 7b.

It is noted that each of the electric field relieving regions 8a and 8b can be formed by, for example, a one-sided abrupt junction type pn junction, a graded junction type pn junction, or a p-i-n junction.

Also, in the electric field relieving regions 8a and 8b, an impurity concentration gradient may preferably be set so that an electric field of 6 MV/cm or more is not applied.

Furthermore, an interlayer dielectric film 9 is formed on the single-crystalline silicon layer 3 where the gate electrode 5 is formed, and source contacts C1 and C2 for making contact with the source layer 6a and the body-source connection layers 7a and 7b are formed on the side of the source layer 6a in a manner to extend across the electric field relieving regions 8a and 8b, respectively. In other words, in the interlayer dielectric film 9, as shown in FIG. 1(c), contact holes K1 and K2 are formed in a manner to extend across the electric field relieving regions 8a and 8b, protruding out over the source layer 6a and the body-source connection layers 7a and 7b.

Also, the source layer 6a and the body-source connection layers 7a and 7b are connected to source wirings 10a and 10b through the contact holes K1 and K2, respectively.

Also, a gate contact C5 for making contact with the gate electrode 5 is formed on the gate electrode 5, and drain contacts C3 and C4 for making contact with the drain layer 6b are formed on the drain layer 6b.

Here, if an n-channel transistor is assumed to be formed in the single-crystalline silicon layer 3, the single-crystalline silicon layer 3 and the body-source connection layers 7a and 7b are set to be p-type, and the source layer 6a and the drain layer 6b are set to be n$^+$ type. Also, the electric field relieving regions 8a and 8b can be set, for example, to be p$^-$ type.

For this reason, even when holes generated at an edge of the drain flow in the body region, they can be discharged to the source wirings 10a and 10b through the body-source connection layers 7a and 7b, and impact ionized carriers are controlled so as not to accumulate in the body region.

Moreover, by providing the electric field relieving regions 8a and 8b along the borders between the source layer 6a and the body-source connection layers 7a and 7b, respectively, impact ionization between the source layer 6a and the body-source connection layers 7a and 7b can be suppressed, carriers in the body region can be released, and the drain breakdown voltage can be prevented from lowering.

FIG. 2(a)-FIG. 4(a) are plan views schematically showing a structure of a semiconductor device in accordance with the first embodiment of the present invention, FIG. 2(b)-FIG. 4(b) are cross-sectional views taken along lines A1-A1 in FIG. 2(a)-FIG. 4(a), respectively, and FIG. 2(c)-FIG. 4(c) are cross-sectional views taken along lines B1-B1 in FIG. 2(a)-FIG. 4(a), respectively.

Referring to FIGS. 2(a)-2(c), for example, a single-crystalline silicon layer 3 is selectively oxidized by using a LOCOS method, thereby forming an element isolation dielectric film 2 for isolating the single-crystalline silicon layer 3.

Then, a gate dielectric film 4 is formed on the single-crystalline semiconductor layer 3 by an appropriate method, such as, for example, thermal oxidation of the single-crystalline semiconductor layer 3. Then, a polycrystalline silicon film is deposited on the gate dielectric film 4 by an appropriate method such as a CVD method. Then, the polycrystalline silicon film is patterned by using a photolithography technique and a dry etching technique, thereby forming a gate electrode 5 on the gate dielectric film 4.

Next, as shown in FIGS. 3(a)-3(c), by using a photolithography technique, a resist layer R1 having an opening section H1 corresponding to a source layer 6a and a drain layer 6b is formed on the single-crystalline semiconductor layer 3. Here, when the resist layer R1 is provided with the opening section H1, body-source connection layers 7a and 7b and electric field relieving regions 8a and 8b shown in FIGS. 1(a)-1(c) may be covered. Then, by using the gate electrode 5 and the resist layer R1 as a mask, impurities, such as, As, P, B or the like are ion-implanted into the single-crystalline semiconductor layer 3, thereby forming a source layer 6a and a drain layer 6b arranged on both sides of the gate electrode 7, respectively, in the single-crystalline semiconductor layer 3.

Next, as shown in FIGS. 4(a)-4(c), after removing the resist layer R1, a resist layer R2 having opening sections H2 and H3 corresponding respectively to body source connection layers 7a and 7b is formed on the single-crystalline semiconductor layer 3. Then, by using the gate electrode 5 and the resist layer R2 as a mask, impurities, such as, As, P, B or the like are ion-implanted into the single-crystalline semiconductor layer 3, thereby forming body source connection layers 7a and 7b that are each separated only a prescribed spacing from the source layer 6a, and forming electric field relieving regions 8a and 8b arranged between the source layer 6a and the body source connection layers 7a and 7b.

Then, after removing the resist layer R2, as shown in FIG. 1(a), an interlayer dielectric film 9 is formed on the single-crystalline semiconductor layer 3 where the gate electrode 5 is formed. Then, contact holes K1 and K2 are formed in the interlayer dielectric film 9, and source wirings 10a and 10b, that are connected to the source layer 6a and the body-source connection layers 7a and 7b through the contact holes K1 and K2, respectively, are formed.

As a result, by changing the shapes of the resist layers R1 and R2 used at the time of forming the source layer 6a and the drain layer 6b or the body-source connection layers 7a and 7b, the electric field between the body-source connection layers 7a and 7b and the source layer 6a can be alleviated while enabling carriers in the body region to be released, and a higher breakdown voltage of the SOI transistor can be achieved while suppressing an increase in the manufacturing steps.

As described above, the embodiments suitable for the present invention have been described, however, the present invention can take various types of embodiments within the spirit of the present invention. For example, it is noted that, in accordance with the present embodiments, a method to form the body-source connection layers 7a and 7b on both sides of the source layer 6a is described. However, one of the body-source connection layers 7a and 7b may be formed on one side of the source layer 6a.

What is claimed is:

1. A semiconductor device comprising:
   a semiconductor layer formed on a dielectric layer;
   a gate electrode disposed on the semiconductor layer;
   a source layer disposed on one side of the gate electrode and formed in the semiconductor layer, the source layer having a gate-electrode-side surface nearest the gate electrode and an opposite surface facing away from the gate electrode;
   a drain layer disposed on another side of the gate electrode and formed in the semiconductor layer;

a body region formed in the semiconductor layer at a position below the gate electrode, the body region being isolated between the source layer and the drain layer;

a body-source connection layer that contacts the source layer and the body region;

an electric field relieving region provided between the source layer and the body-source connection layer, the electric field relieving region extending from the gate-electrode-side surface of the source layer to the opposite surface of the source layer so as to separate the source layer and the body-source connection layer; and a contact region that directly contacts the electric field relieving region and that connects the source layer and the body-source connection layer.

2. A semiconductor device according to claim 1, characterized in that the electric field relieving region defines a one-sided abrupt junction type pn junction, a graded junction type pn junction, or a p-i-n junction.

3. A semiconductor device according to claim 2, characterized in that the semiconductor layer formed on the dielectric layer is formed on a SOI wafer.

4. A semiconductor device according to claim 1, characterized in that the electric field relieving region has an impurity concentration gradient set so that an electric field of 6 MV/cm or more is not applied.

5. A semiconductor device according to claim 4, characterized in that the semiconductor layer formed on the dielectric layer is formed on a SOI wafer.

6. A semiconductor device according to claim 1, characterized in that the semiconductor layer formed on the dielectric layer is formed on a SOI wafer.

7. A semiconductor device according to claim 1, characterized in that the electric field relieving region defines a one-sided abrupt junction type pn junction, a graded junction type pn junction, or a p-i-n junction.

8. A semiconductor device according to claim 1, characterized in that the electric field relieving region has an impurity concentration gradient set so that an electric field of 6 MV/cm or more is not applied.

9. A semiconductor device according to claim 1, characterized in that the semiconductor layer formed on the dielectric layer is formed on a SOI wafer.

10. The semiconductor device according to claim 1, the semiconductor layer being a p type, the source layer being an n+ type, the drain layer being an n+ type, the body-source connection layer being a p type, and the electric field relieving region being a p− type.

* * * * *